United States Patent [19]

von Raben

[11] Patent Number: 4,854,494
[45] Date of Patent: Aug. 8, 1989

[54] MONITORING BOND PARAMETERS DURING THE BONDING PROCESS

[75] Inventor: Klaus-Ulrich von Raben, Munich, Fed. Rep. of Germany

[73] Assignee: Siemens Aktiengesellschaft, Berlin and Munich, Fed. Rep. of Germany

[21] Appl. No.: 140,122

[22] Filed: Dec. 31, 1987

[30] Foreign Application Priority Data

Jan. 21, 1987 [DE] Fed. Rep. of Germany ....... 3701652

[51] Int. Cl.⁴ .............................................. B23K 20/10
[52] U.S. Cl. .................... 228/102; 228/103; 228/110; 228/1.1; 228/9; 73/582; 73/588
[58] Field of Search ............. 228/102, 103, 110, 111, 228/1.1, 8, 9, 904; 73/582, 588, 659; 156/73.1

[56] References Cited

U.S. PATENT DOCUMENTS

| | | |
|---|---|---|
| 3,453,540 | 7/1969 | Dusheck . |
| 3,827,619 | 8/1974 | Cusick et al. . |
| 3,857,279 | 12/1974 | Salzer et al. ........................... 73/582 |
| 4,040,885 | 8/1977 | Hight et al. .......................... 228/110 |
| 4,603,802 | 8/1986 | Kurtz et al. .......................... 228/102 |

FOREIGN PATENT DOCUMENTS

| | | |
|---|---|---|
| 2901253 | 7/1980 | Fed. Rep. of Germany ....... 228/1.1 |
| 2937538 | 3/1981 | Fed. Rep. of Germany ...... 228/110 |
| 3435511 | 4/1986 | Fed. Rep. of Germany . |
| 32900 | 8/1972 | Japan .................................. 228/102 |
| 677852 | 8/1979 | U.S.S.R. ................................. 228/8 |

OTHER PUBLICATIONS

"Ultrasonic Wire Welding" by Johnson et al, Solid State Technology, Mar. 1977, pp. 50-56.

Primary Examiner—Nicholas P. Godici
Assistant Examiner—Samuel M. Heinrich
Attorney, Agent, or Firm—Hill, Van Santen, Steadman & Simpson

[57] ABSTRACT

A method of monitoring bonding parameters during a bonding process. The method is based on the object of continuous monitoring of bonding parameters in order to provide adjustment of bonding machines and thereby increase the reliability of the bonded connections. A bonding force is measured by a wire strain gauge attached to a bonding arm and an ultrasound amplitude is measured by a piezo-electric sensor secured to the bonding arm. The method can be used with all bonding machines which work with ultrasound.

15 Claims, 2 Drawing Sheets

MONITORING BOND PARAMETERS DURING THE BONDING PROCESS

BACKGROUND OF THE INVENTION

The invention relates to the continuous monitoring of bonding force and of ultrasound amplitude during bonding processes with semi-automatic and fully automatic bonding machines.

Bonding is a mechanical connecting method which also simultaneously produces an electrical contact between the parts to be connected. This is achieved in a wire-bonding in that two parts that are initially mechanically non-identical (for example, a chip and a wire) are connected to one another by matching their surface structure.

During the manufacture of integrated circuits, chips are glued into a carrier member and are contacted to a frame with thin gold or aluminum wires. Since no equipment has been previously available for monitoring the semi-automatic and fully automatic bonding machines, serious adjustment deviations of the bonding machines frequently occur over the course of time. This causes a deterioration of the quality of the bond connections.

German published application No. 34 35 511 describes and shows an electrode for incorporation in resistance spot-welding machines. Wire strain gauges are applied to the electrode shank of this apparatus for measuring a bending moment during a milling. This, however, does not achieve a combined measured result in the sense of the present invention (continuous and simultaneous measurement of bonding force and ultrasound amplitude).

U.S. Pat. No. 3,857,279 describes the technique of measuring the 60 kHz ground frequency of bonding machines and its harmonies (multiples of the ground signal frequency).

SUMMARY OF THE INVENTION

An object of the present invention is to create a means for monitoring defined at the outset so that it becomes possible to continuously measure the bonding parameters of bonding force and ultrasound amplitude during the bonding process and to record them and, thereby, to monitor and to control the bonding machine itself as well as the bonded connection.

In a monitoring of the species initially set forth, this object is inventively achieved by the features of the present invention. A method of monitoring bonding parameters during a bonding process is based on the object of continuous monitoring of bonding parameters in order to provide adjustment of bonding machines and thereby increase the reliability of the bonded connections. A bonding force is measured by a wire strain gauge attached to a bonding arm and an ultrasound amplitude is measured by a piezo-electric sensor secured to the bonding arm. The method can be used with all bonding machines which work with ultrasound.

The significant advantage of the invention is that the bonding force and the ultrasound amplitude can thus be simultaneously and continuously recorded and analyzed over the course of the entire bonding process. The measured signals (and eventually the temperature of the circuit) will be combined to one value which characterizes the bonding process and enables one to control the bonding machine.

From an electrically connected evaluation apparatus, the course of the bonding force and the ultrasound can be subsequently outputted, for example, to a printer or plotter. Such test protocols serve the purpose of evaluation and can be used for illustrating the courses of the bonding force and of the ultrasound signal.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several figures of which like reference numerals identify like elements, and in which:

DESCRIPTION OF THE PREFERRED EMBODIMENT

Figure 1:
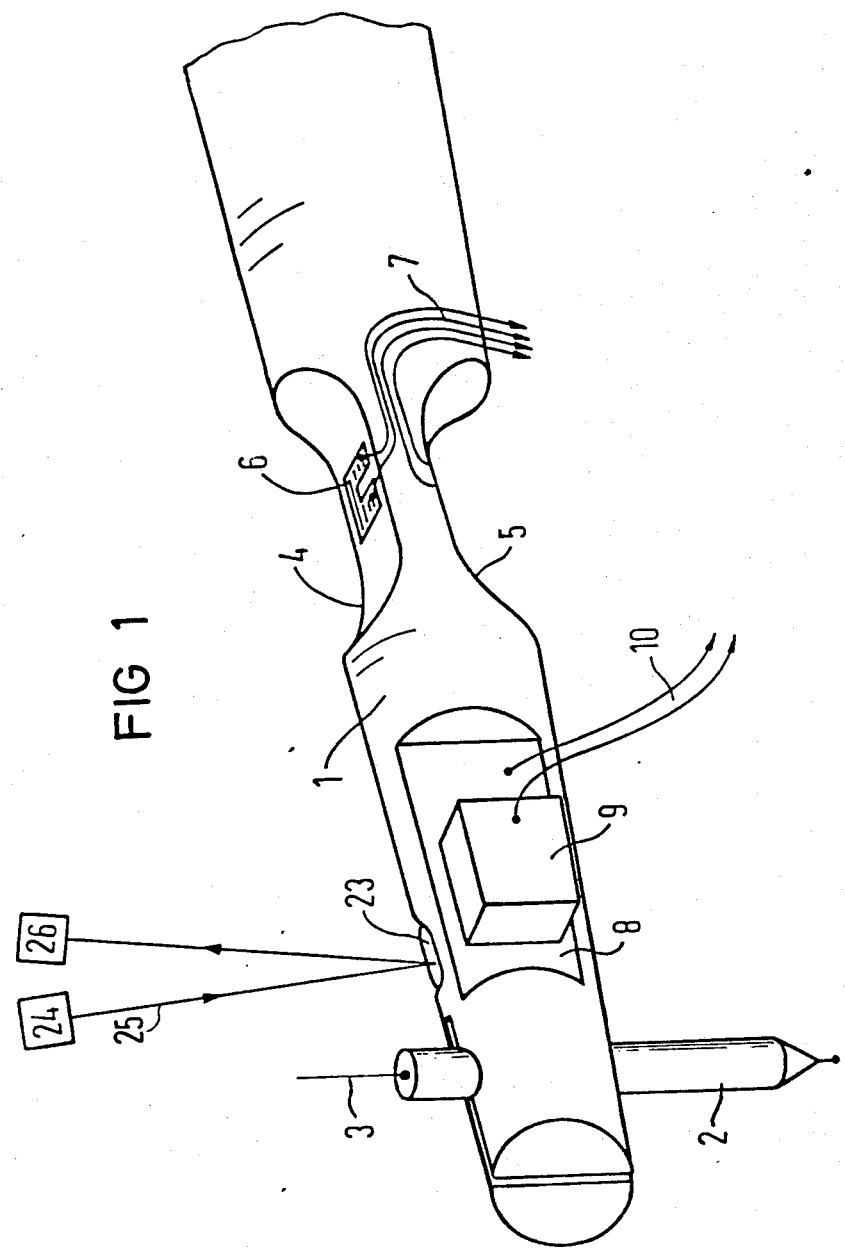
FIG. 1 is a perspective view of a bonding arm having a means for monitoring bonding parameters.

The invention shall be set forth with reference to an exemplary embodiment having a wire strain gauge as a forcesensing device. Referring now to FIG. 1, a bonding arm 1 has a wire 3 of, for example, gold or aluminum, proceeding through its bonding tip 2. Wire strain gauges are attached at the upper side 4 and under side 5 of the bonding arm 1 having a substantially circular cross-section, only the upper wire strain gauge 6 thereof being visible in the FIG. 1. These strain gauges can also be attached to the bonding arm at flat milled portions at the upper side and under side of the bonding arm. Connecting lines 7 lead from the wire strain gauge 6 to an amplifier (not shown) for receiving the bonding force signal. A sensor is arranged in a lateral milled portion 8, this sensor being connected via lines 10 to an amplifier (not shown) for receiving the ultrasound signals. Given a bonding arm which has a flat location from the very outset, the necessity of milling can be eliminated.

Figure 2:
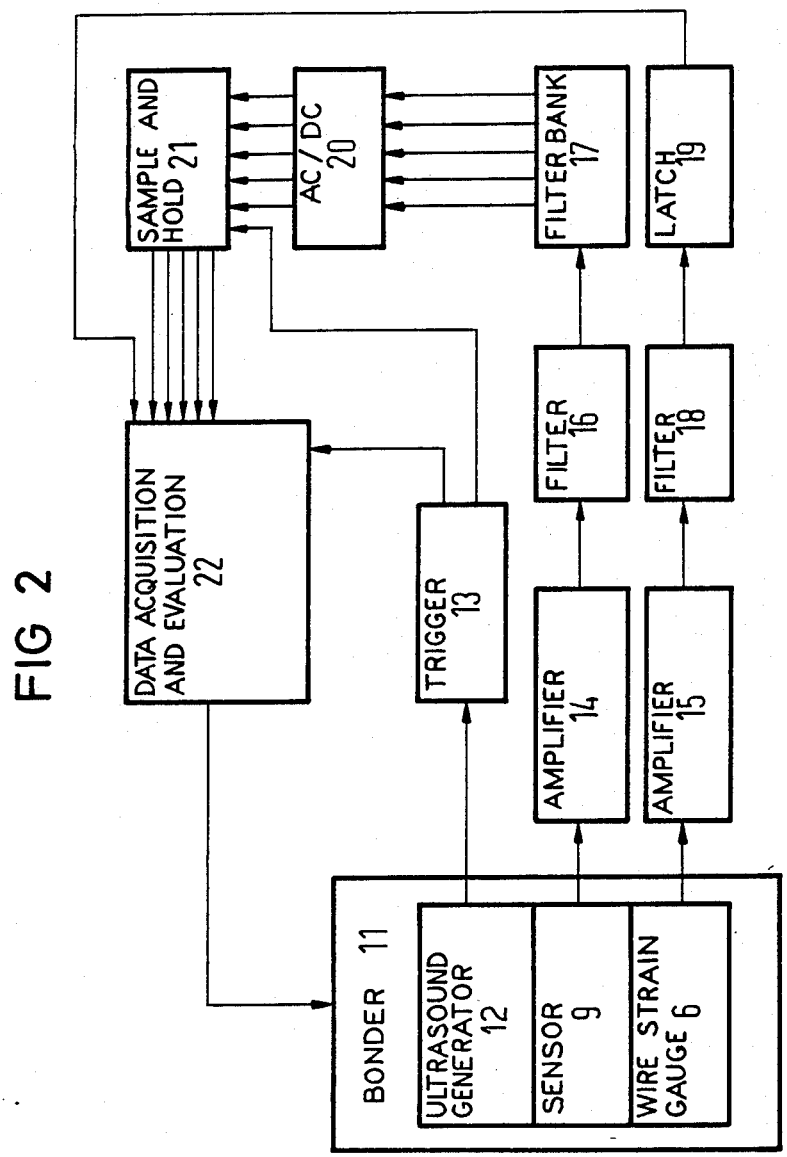
FIG. 2 is a block diagram of the electronics for this procedure.

According to the illustration in FIG. 2, a bonder 11 has the following, signal-emitting parts, in addition to other parts: an ultrasound generator 12 connected to a trigger 13, the sensor 9 on the bonding arm connected to an amplifier 14, and the wire strain gauge 6 on the bonding arm connected to an amplifier 15, for example to an operational amplifier. At its output side, the amplifier 14, which can likewise be an operational amplifier, is connected to a 60 kHz high-pass filter 16 whose output leads to a filter bank 17. The filter bank 17 is composed of bandpass filters for the upper harmonics of the fundamental frequency of the ultrasound generator (60 kHz). The five arrows shown at the output side of the filter bank symbolize that, for example, the frequencies 60, 120, 180, 240 and 300 kHz are forwarded for further processing. Intermediate values are thus impossible; however, the evaluation of further multiples of the fundamental frequency is possible.

The signals of the amplifier 15 proceed into a filter 18 to which an intermediate memory (latch) 19 is connected. A sample-and-hold component 21 whose values enter into the data acquisition and evaluation means 22 is connected to the output of an AC/DC converter 20.

The bonding parameter of bonding force is acquired by the wire strain gauge 6 attached to the bonding arm 1. At these locations, the glued-on wire strain gauge 6 measures the vertical bending of the bonding arm 1 during the bonding process. The vertical bending of the bonding arm is the bending mode in a vertical direction (up and down). This value is proportional to the bonding force, so that a suitable, amplified output is a voltage proportional to the force. This voltage is supplied to the data acquisition and evaluation equipment 22 via the filter 18, for example a low-pass filter, and via a latch 19.

As shown in FIG. 1, the measuring device may be different reflection of a light ray impinging the bonding arm. A flattened surface 23 is provided on the surface of the bonding arm 1, upon which a light beam 25 of a light transmitter 24 impinges, this light beam 25 being reflected at the surface 23 to a light measuring device 26.

The measuring and monitoring of the ultrasound parameter occurs by measuring the ultrasound amplitude at the bonding arm 1 itself. To this end, the bonding arm 1 is milled flat at its side and is equipped with a piezo-electric sensor 9. This sensor 9 registers the ultrasound signal during the bonding process and conducts it to a suitable amplifier 14. Following this amplifier 14 stage, the signal is divided into several parts in the high-pass filter 16 in terms of frequency, these parts corresponding to whole-numbered multiples of the fundamental frequency of 60 kHz (frequency of the ultrasound generator 12). A separate measurement of the fundamental frequency of 60 kHz and of the upper harmonics is thereby provided. Since the part of the upper harmonics is conditioned by the interaction of the bonding arm 1 with the integrated circuit (via bonding tip 2 and gold), this measurement, namely the fundamental frequency and part of the upper harmonics, can measure and continuously monitor this influencing variable on the bonded connection. The individual parts of the ultrasound signal which are divided in terms of frequency are acquired by the data evaluation device 22 and are further-processed. To this end, the signals are converted into a DC voltage (module 20) and their momentary amplitude at the point in time of bonding is retained, for example, with the sample-and-hold module 21.

These measured parameters of bonding force and ultrasound amplitude are read out at a given point in time (trigger pulse of the ultrasound generator 12) together with other values (for example, temperature of the module) and are supplied to the evaluation device 22. Here, the measured values are further processed and are compared to standard data, this creating the possibility of evaluating the executed bonded connection. The measured signals are combined to one single value which characterizes the bonding process. Further, the various bonding parameters of the bonding machine can be followed-up via a control event and can thus be kept constant. A constant quality of the bonded connection is thereby assured.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A method for continuous and simultaneous monitoring of bonding parameters of at least a bonding force and of an ultrasound amplitude during bonding processes with semi-automatic and fully automatic bonding machines, comprising the steps of: attaching at least two measuring devices on opposed sides of a bonding arm for acquiring a bonding force parameter, these measuring devices measuring a bending mode in the vertical direction of the bonding arm which is proportional to the bonding force; and providing a piezo-electric sensor for measuring ultrasound amplitude, said sensor attached to a lateral milled portion on the bonding arm and producing an ultrasound signal; and supplying all measured values of the bending mode in the vertical direction and ultrasound amplitude to a means for data acquisition and evaluation after amplification of the measured values; and combining all the measured parameters to one single value which characterizes the bonding process and enables one to control the bonding machine.

2. The method of monitoring according to claim 1, wherein the amplified ultrasound signal is divided into a plurality of parts in terms of frequency, these parts corresponding to whole-numbered multiples of a fundamental frequency supplied by an ultrasound generator; and converting each of the parts divided in terms of frequency into a DC voltage and storing a momentary amplitude thereof at a predetermined point in time of bonding.

3. The method of monitoring according to claim 2, wherein the fundamental frequency is 60 kHz.

4. The method of monitoring according to claim 2, wherein the momentary amplitude is retained with a sample-and-hold module.

5. The method of monitoring according to claim 1, wherein the measured values relating to at least bonding force and ultrasound amplitude are read out at an adjustable point in time and are then supplied to the means for data acquisition and evaluation.

6. The method of monitoring according to claim 5, wherein the measured values further includes a measured value of temperature.

7. The method of monitoring according to claim 5, wherein an actual value is compared to a standard value in the means for data acquisition and evaluation and the bonding machine is then controlled dependent on this comparison.

8. The method of monitoring according to claim 1, wherein methods based on different reflection of a light ray impinging the bonding arm are employed as measuring devices.

9. The method of monitoring according to claim 1, wherein equipment for electrical measuring is mechanically applied to the bonding arm as the measuring device.

10. The method of monitoring according to claim 9, wherein the mechanically electrical measuring equipment is a wire strain gauge.

11. A method for continuous and simultaneous monitoring of bonding parameters during bonding processes with semi-automatic and fully automatic bonding machines, comprising the steps of:
providing a bonding arm attached to the bonding machine;
attaching to the bonding arm at least two means for measuring bending amplitude in the vertical direction of the bonding arm and producing a bonding force signal indicative of the bending amplitude in the vertical direction, this vertical bending being proportional to a bonding force, said two means for measuring being attached to opposing sides of said bonding arm;

attaching to a lateral milled portion of the bonding arm means for measuring ultrasound amplitude and producing an ultrasound signal indicative of the ultrasound amplitude;

amplifying the bonding force signal and the ultrasound signal;

supplying the amplified bonding force signal and the amplified ultrasound signal to a means for data acquisition and evaluation.

12. The method of monitoring according to claim 11, wherein said means for measuring a vertical bending is a wire strain gauge.

13. The method of monitoring according to claim 11, wherein said means for measuring ultrasound amplitude is a piezoelectric sensor.

14. The method of monitoring according to claim 11, wherein said method further comprises after amplifying the ultrasound signal; dividing the amplified ultrasound signal into a plurality of parts in terms of frequency, these parts corresponding to whole-numbered multiples of a fundamental frequency supplied by an ultrasound generator connected to the bonding machine; converting the parts into respective DC voltages; and storing momentary amplitudes of the DC voltages at a predetermined point in time of bonding.

15. The method of monitoring according to claim 14, wherein said method further comprises comparing the bonding parameters to standard data in the means for data acquisition and evaluation and controlling the bonding machine by this comparison.

* * * * *